United States Patent [19]

Rhodes

[11] Patent Number: 5,781,084

[45] Date of Patent: Jul. 14, 1998

[54] MICROWAVE REFLECTION FILTER INCLUDING A LADDER NETWORK OF RESONATORS HAVING PROGRESSIVELY SMALLER Q VALUES

[75] Inventor: John David Rhodes, Guiseley, United Kingdom

[73] Assignee: Filtronic Comtek PLC, West Yorkshire, England

[21] Appl. No.: 663,145

[22] PCT Filed: Dec. 15, 1994

[86] PCT No.: PCT/GB94/02747

§ 371 Date: Jun. 10, 1996

§ 102(e) Date: Jun. 10, 1996

[87] PCT Pub. No.: WO95/17023

PCT Pub. Date: Jun. 22, 1995

[30] Foreign Application Priority Data

Dec. 15, 1993 [GB] United Kingdom .................. 9325661

[51] Int. Cl.[6] ........................................ H01P 1/20
[52] U.S. Cl. ............................................. 333/202
[58] Field of Search ........................ 333/202, 202 DB, 333/202 DR

[56] References Cited

U.S. PATENT DOCUMENTS

| | | | |
|---|---|---|---|
| 3,760,303 | 9/1973 | Seidel | 333/202 X |
| 4,296,389 | 10/1981 | Fuller et al. | 333/160 |
| 4,418,324 | 11/1983 | Higgins | 333/204 |
| 4,538,123 | 8/1985 | Mariani et al. | 333/208 |

FOREIGN PATENT DOCUMENTS

| | | | |
|---|---|---|---|
| 0262391 | 8/1987 | European Pat. Off. | |
| 1561131 | 4/1990 | U.S.S.R. | 333/202 |
| 1122742 | 11/1964 | United Kingdom | |
| 2232304 | 5/1989 | United Kingdom | |

OTHER PUBLICATIONS

Akao et al.; "A Quarter-Wave Coupled Band-Rejection Filter with maximally Flat Pass-Band Characteristics"; *Electronics and Communications in Japan*, vol. 52-B, No. 8, Apr. 1969; pp. 94–102.

"A Method of Designing Microwave AFR and PFR Equalizers", Znamenskiy et al., Telecommunications and Radio Engineering, vol. 39/49 No.5, May 1985 pp. 108–111.

"Microwave Filters, Impedance-Matching Networks, and Coupling Structures" Matthaei et al., pp. 85–86, 1964, McGraw Hill Book Company.

*Primary Examiner*—Benny Lee
*Assistant Examiner*—Barbara Summons
*Attorney, Agent, or Firm*—David P. Gordon; Thomas A. Gallagher; David S. Jacobson

[57] ABSTRACT

A variable Q reflection mode filter has a three-port circulator, one port of which is terminated by a one-port filter. The filter includes a ladder network of resonators, successive of the resonators having progressively reducing Q values. The filter increases the overall 3 dB resonance point of the filter to reduce the unloaded Q factors required for particular applications. The filter may be arranged to provide a maximally flat response, an equiripple response, or a quasi-ripple response. Transmission zeros may also be incorporated to further enhance the effective unloaded Q.

12 Claims, 6 Drawing Sheets

MICROWAVE REFLECTION FILTER INCLUDING A LADDER NETWORK OF RESONATORS HAVING PROGRESSIVELY SMALLER Q VALUES

BACKGROUND OF THE INVENTION

1. Field of the Invention

This invention relates to a microwave filter and more particularly to a variable Q reflection mode microwave filter.

2. State of the Art

All passive resonators have a finite unloaded Q factor. In narrow bandwidth applications, this resistive loss can lead to difficulties in the design process. In a bandpass application, designs which provide for both a good input and output match exhibit transfer characteristics with significant amplitude variation over the passband if mid band loss is minimised. This passband variation can only be reduced with given Q factors if the mid band loss is increased, possibly to an unacceptable level. Even in the case of a single resonator, filter problems occur due to the resistive loss which prevents a good input and output match being simultaneously achievable.

In the case of a narrow band bandstop application, the resistive loss of the resonators causes a roll-off of the insertion loss into the passband. A reduction in unloaded Q can quickly cause this loss to reach an unacceptable level, particularly where noise figure is important and the notch filter has been introduced to reject signals which would limit the dynamic range of the receiver. This requirement now exists in several countries where cellular telephone systems have multi-operator configurations.

In a conventional bandstop filter, resonators are coupled off from a main through-line with an electrical separation of an odd number of 90°. Each resonator couples loss into the system and this can be further increased by additional loss in the through-line. To meet a typical requirement at 900 MHz, at least 20 dB rejection has to be provided over a band in excess of 1 MHz, whilst the loss at the 1.5 MHz bandwidth is less than 2 dB. To achieve this, unloaded Q's of greater than 20,000 are required, resulting in the necessity to use dielectric resonators for all of the cavities.

To meet rejection levels of 20 to 30 dB, an alternative method may be used based upon the use of a bandpass filter connected to a 3 dB hybrid, as set out in our UK patent application No. 9324149.5: this "hybrid notch filter" is more compact and provides a slightly lower loss, but still needs unloaded Q's of the order of 20,000 for all cavities. However, we have now devised a filter which acts as a true reflection mode filter and meets the above requirements with much lower unloaded Q's.

SUMMARY OF THE INVENTION

In accordance with this invention, there is provided a microwave reflection mode filter which comprises a three-port circulator device having one port terminated by a one-port filter.

The filter may be arranged, as explained herein, to provide a maximally flat response. Instead, the filter may be arranged, also as explained herein, to provide an equiripple (or quasi equiripple) response.

It will be appreciated that low loss circulators, suitable for use in the filter of this invention, are readily available on the market.

Embodiments of this invention will now be described by way of examples only and with reference to the accompanying drawings.

DETAILED DESCRIPTION OF THE PREFERRED EMBODIMENT

Figure 1:
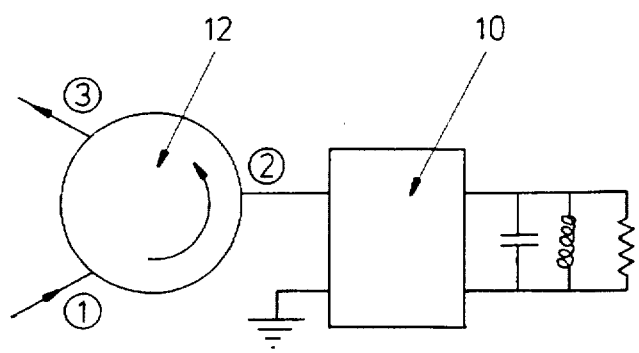
FIG. 1 is a schematic diagram of a filter in accordance with this invention.

Referring to FIG. 1 of the drawings, there is diagrammatically shown a filter which comprises a resonant circuit 10 with loss, coupled to one of the ports of a circulator 12. The transmission characteristic from ports 1 to 3 of the circulator is the reflection characteristic from the network 10 connected to port 2. Assume that the coupling into the resonant circuit is adjusted such that the resistive part at resonance is matched to the impedance of the circulator, then at resonance all of the power supplied at port 1 emerges at port 2 and is absorbed in the resistive part of the resonator. Hence, there is no transmission to port 3. In this case the transmission characteristic from ports 1 to 3 of the circulator is of a single resonator with an infinite rejection at centre frequency, i.e. as if the resonance were from a resonator of infinite unloaded Q. If fo is the centre frequency and B the 3 dB bandwidth of the resonance, then by a simple calculation the unload Q (Qu) of the resonator is given by:

$$Qu = \frac{2fo}{B} \tag{1}$$

For example if B=250 KHz and fo=1 GHz, then Qu=8,000. This shows that the type of specification previously considered can be met with cavities of much lower Qu if a design procedure is established for a multi-element filter.

The following discussion concerns the design for a variable Q reflection mode filter and in particular designs which provide a maximally flat response and a quasi equiripple response. The discussion provides solutions to the approximation problem and subsequent investigation of the synthesis leads to explicit design formulas for filters of arbitrary degree. Two examples of 5th and 6th degree filters will be given designed around the previous specification and the measured results are shown to be in good agreement with theory. Furthermore, it will be shown that by adding transmission zeros into the reflection mode filter, further enhancement in effective unloaded Q can be obtained: a 6th degree device will be discussed to demonstrate this point.

Figure 2:
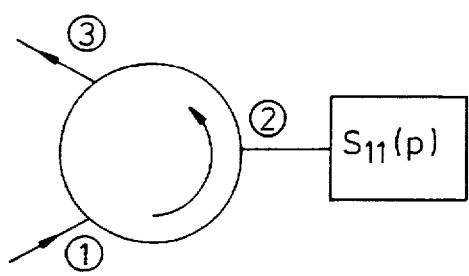
FIG. 2 is a diagram for use in explaining principles on which the filter of FIG. 1 is based.
Figure 3:
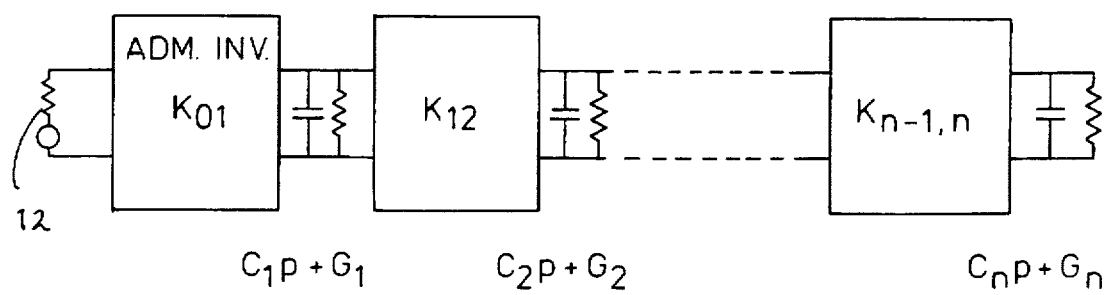
FIG. 3 is a schematic diagram of a lossy ladder network for use in the filter of FIG. 2.

Firstly a reflection mode filter with a Maximally Flat response will be discussed with reference to FIG. 2. Using a circulator, the reflection coefficient $S_{11}(p)$ of a reflection mode filter becomes the transmission coefficient of the overall device shown in FIG. 2. Assuming that the circulator 12 is normalised to $1\Omega$ impedance, then in lowpass prototype form as shown in FIG. 3 a Maximally Flat response will be achieved if:

$$|S_{11}(j\omega)|^2 = \frac{\omega^{2n}}{D_n(\omega^2)} \quad (2)$$

where n is the degree of the filter and $D_n(\omega^2)$ is a polynomial of degree n in $\omega^2$ with:

$$\omega^{2n} \leq D_n(\omega^2) \quad (3)$$

For the normal maximally flat response:

$$|S_{11}(j\omega)|^2 = \frac{\omega^{2n}}{1 + \omega^{2n}} \quad (4)$$

and the resulting network is a lowpass ladder network with infinite Qu terminated in a $1\Omega$ resistor.

Initially consider the case where each resonator will have the same Qu. Assume that the ratio of conductance to capacitance of each shunt element is normalised to ½ and using the transformation $$z = 2p + 1 \quad (5)$$

then the input admittance of the network may be expressed as a reactance function Y(z). Hence:

$$S_{11}(p) = \frac{1 - Y(z)}{1 + Y(z)} \quad (6)$$

where p is the complex frequence variable
($p = j\omega$ assuming a sinusoidal input signal), where p is the complex frequency variable ($p=j\omega$ assuming a sinusoidal input signal), and for a maximally flat response around $p=0$:

$$S_{11}(p) = \left(\frac{1-z}{1+z}\right)^n \quad (7)$$
$$= \left[\frac{-p}{1+p}\right]^n$$

where:

$$Y(z) = \frac{(1+z)^n - (1-z)^n}{(1+z)^n + (1-z)^n} \quad (8)$$
$$= \tanh[n \tanh^{-1}(z)]$$

Now:

$$|S_{11}(j\omega)|^2 = \frac{\omega^{2n}}{(1+\omega^2)^n} \quad (9)$$

and let the return loss $L_R = L_1 (\approx 20$ dB$)$ for $\omega < \omega_s$ and $L_R = L_2$ ($\approx 1$ dB) for $\omega > \omega_p$, then:

$$10\log\left[1 + \frac{1}{\omega_s^2}\right]^n = L_1 \quad (10)$$

and $$10\log\left[1 + \frac{1}{\omega_p^2}\right]^n = L_2 \quad (11)$$

Therefore:

$$\frac{1}{\omega_s^2} = 10^{\frac{L_1}{10n}} - 1 \quad (12)$$

$$\frac{1}{\omega_p^2} = 10^{\frac{L_2}{10n}} - 1$$

and for n large:

$$\frac{\omega_p}{\omega_s} \rightarrow \frac{L_1}{L_2} \quad (13)$$

and hence there is a fundamental limit to the ratio of the passband frequency to the stopband frequency.

To achieve the objective, a response is required between the response in equation (4) and that in equation (9). One such response is:

$$|S_{11}(j\omega)|^2 = \sum_{r=0}^{n} \frac{\omega^{2n}}{\omega^{2r}} \quad (14)$$
$$= \frac{(1-\omega^2)\omega^{2n}}{(1-\omega^{2n+2})}$$

In this case:

$$10\log\left[\frac{1 - \frac{1}{\omega_s^{2n+2}}}{1 - \frac{1}{\omega_s^2}}\right] = L_1 \quad (15)$$

and $$10\log\left[\frac{1 - \frac{1}{\omega_p^{2n+2}}}{1 - \frac{1}{\omega_p^2}}\right] = L_2$$

hence:

$$\frac{1}{\omega_s^2} = 10^{\frac{L_1}{10n}}$$

$$\frac{1}{\omega_p^2} \approx 1 - 10^{\frac{-L_2}{10}}$$

and $$\frac{\omega_p}{\omega_s} = \frac{10^{\frac{L_1}{20n}}}{\sqrt{1 - 10^{\frac{-L_2}{10}}}} \quad (16)$$

For $L_1=20$ dB, $L_2=1$ dB and $n=7$:

$$\frac{\omega_p}{\omega_s} = 3.06$$

as compared to 1.53 from the normal maximally flat response given in equation (4).

From equation (14) the following bounded real reflection coefficient may be formed:

$$S_{11}(p) = \prod_{r=1}^{n} \frac{p^n}{(p - je^{j\theta_r})} \quad (17)$$

with $$\theta_r = \frac{r\pi}{n+1} \quad (18)$$

where $\theta_r$ is a constant applicable to the $r$th resonator.

where $\theta_r$ is a constant applicable to the $r^{th}$ resonator. Forming the input admittance $$Y(p) = \frac{1 - S_{11}(p)}{1 + S_{11}(p)} \quad (19)$$

and synthesising as the lossy ladder network shown in FIG. 3, explicit formulas are obtained for element values given by:

$$K_{r-1,r} = 1 \quad r=1 \to n \quad (20)$$

where $K_{r-1,r}$ is the admittance inverter value for the coupling between the $(r-1)^{th}$ and $r^{th}$ resonator, and if $$E_{r-1}E_r = \left[ \frac{\cos\theta + \cos(r\theta)}{\cos\theta + \cos((r-1)\theta)} \right] \quad r=1 \to n \quad (21)$$

where $E_r$ and $E_{r-1}$ are intermediate variables and $C_r$ is the capacitance of the $r^{th}$ resonator, with $$\theta = \frac{\pi}{n+1}$$

then:

$$c_r = \frac{1}{\cos\theta} \left[ \frac{\sin((r-1)\theta)}{E_{r-1}} + \sin(r\theta)E_r \right]$$

and $$G_r = \frac{1}{E_{r-1}} - E_r \quad (22)$$

where $G_r$ is the conductance of the $r^{th}$ resonator.

It can also be shown that:

$$c_r > 0, G_r > 0 \quad r = 1 \to n \quad (23)$$

To illustrate the use of these explicit formulas, consider the case of n=5. Then:

$$\theta = \frac{\pi}{6}, \cos\theta = \frac{\sqrt{3}}{2}$$

$$E_o = 1$$

$$E_oE_1 = \frac{\sqrt{3}}{1 + \frac{\sqrt{3}}{2}}, E_1 = 2\sqrt{3}\,(2-\sqrt{3})$$

$$E_1E_2 = \frac{\sqrt{3}+1}{2\sqrt{3}}, E_2 = \frac{5+3\sqrt{3}}{12} \quad (24)$$

$$E_2E_3 = \frac{\sqrt{3}}{\sqrt{3}+1}, E_3 = 6\sqrt{3}\,(7-4\sqrt{3})$$

$$E_3E_4 = \frac{\sqrt{3}-1}{\sqrt{3}}, E_4 = \frac{5+3\sqrt{3}}{18}$$

$$E_4E_5 = 0, E_5 = 0$$

Therefore:

$$C_1 = 2(2-\sqrt{3}), G_1 = 7 - 4\sqrt{3}$$

$$C_2 = \frac{(9+5\sqrt{3})}{12}, G_2 = \frac{1+\sqrt{3}}{12}$$

$$C_3 = 6(9-5\sqrt{3}), G_3 = 6(7-4\sqrt{3}) \quad (25)$$

$$C_4 = \frac{19+11\sqrt{3}}{18}, G_4 = \frac{7+4\sqrt{3}}{18}$$

$$C_5 = 9(3\sqrt{3}-5), G_5 = 9(3\sqrt{3}-5)$$

Also, defining the normalised Q of each resonator as $$Q_r = \frac{C_r}{G_r} \quad (26)$$

then from equations (21) and (22):

$$Q_r = \frac{\cos\left(\frac{\theta}{2}\right) + \cos\left(r - \frac{1}{2}\,\theta\right)}{\sin\left(\frac{\theta}{2}\right)} \quad (27)$$

$$r = 1 \to n$$

or $$r = 1 \to 1n$$

$$Q_r = \frac{2\cos\frac{(r\theta)}{2}\cos\frac{(r-1)\theta}{2}}{\sin\frac{\theta}{2}} \quad (28)$$

which directly assists in determining the relative Q's of each cavity.

Consideration will now be given to a quasi equiripple reflection mode filter. Extending the normally maximally flat response to the equiripple case gives:

$$|S_{11}(j\omega)|^2 = \frac{\epsilon^2 T_n^2(\omega)}{1 + \epsilon^2 T_n^2(\omega)} \quad (29)$$

where $$T_n(\omega) = \cos[n\cos^{-1}(\omega)] \quad (30)$$

where $T_n(\omega)$ is the Chebyshev polynomial of $n$th degree, where $T_n(\omega)$ is the Chebyshev polynomial of nth degree, with the resulting lowpass ladder network having infinite Qu and terminated in a 1Ω resistor.

For the case of uniform Qu, it may readily be demonstrated that $$|S_{11}(j\omega)|^2 = \prod_{r=1}^{n} \frac{(\omega - \omega_r)^2}{|1 + (\omega - \omega_r)^2|} \quad (31)$$

and using optimisation the $\omega_r$, $r=1 \to n$ may be chosen to provide an equiripple response. For example, for n=7, the $\omega_r$ are 0, ±1.95, ±3.85, ±5.51 to give a 20 dB stopband level. However, as in the maximally flat case, as the degree of the network is increased, the selectivity tends to a limit and this prototype has restricted value.

It is not obvious how to extend the desirable maximally flat response given in equation (14) to an equiripple response. However, it is possible to readily generate the quasi equiripple function:

$$|S_{11}(j\omega)|^2 = \frac{\alpha^2(1-\omega^2)(1-T_{n+1}^2(\alpha\omega))}{(1-\alpha^2\omega^2)(T_{n+1}^2(\alpha) - T_{n+1}^2(\alpha\omega))} \quad (32)$$

where $\alpha$ is a constant which determines the ripple level, $(\alpha > 1)$ where $\alpha$ is a constant which determines the ripple level. This function is of degree n in $\omega^2$ due to the cancellation of both the factors $(1-\omega^2)$ and $(1-\alpha^2\omega^2)$. The ripple level in the stopband is given by:

$$L_1 = \frac{\alpha^2}{T_{n+1}^2(\alpha)} \quad (33)$$

Figure 4:
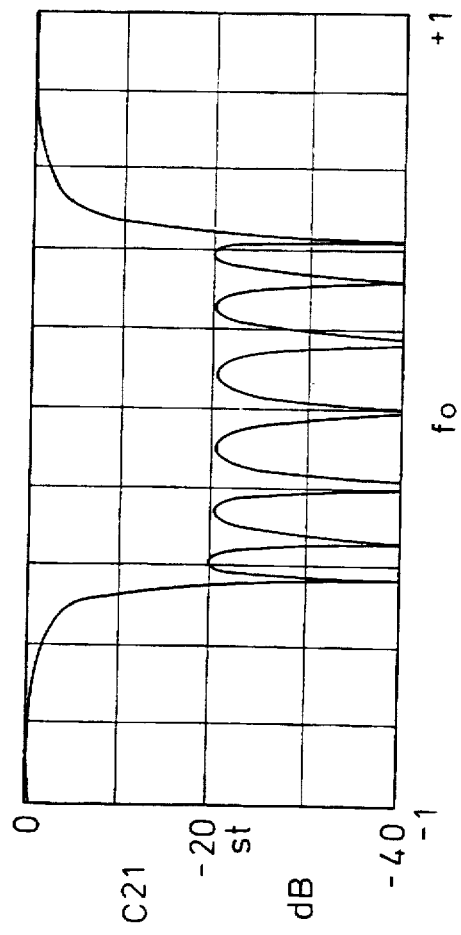
FIG. 4 shows the theoretical quasi equiripple response (with 20 dB stopband level) of a filter having a 7th degree ladder network.

For $L_1=20$ dB, then $\alpha=1.100$, 1.077, 1.060 for n=6,7 and 8 respectively. Thus, since $\alpha$ is of the order of unity, the factor $$\frac{\alpha^2(1-\omega^2)}{(1-\alpha^2\omega^2)} \quad (34)$$

causes very little deviation from the equiripple behaviour. This is illustrated in FIG. 4 for the case of n=7.

Forming the bounded real reflection coefficient from equation (32) gives $$S_{11}(p,\alpha) = \prod_{r=1}^{n} \left[ \frac{(p\alpha - j\cos\theta_r)}{(p\alpha - j\cos(\cos^{-1}(\alpha) + \theta_r)} \right] \quad (35)$$

where $$\theta_r = \frac{r\pi}{(n+1)} \quad (36)$$

Figure 5:
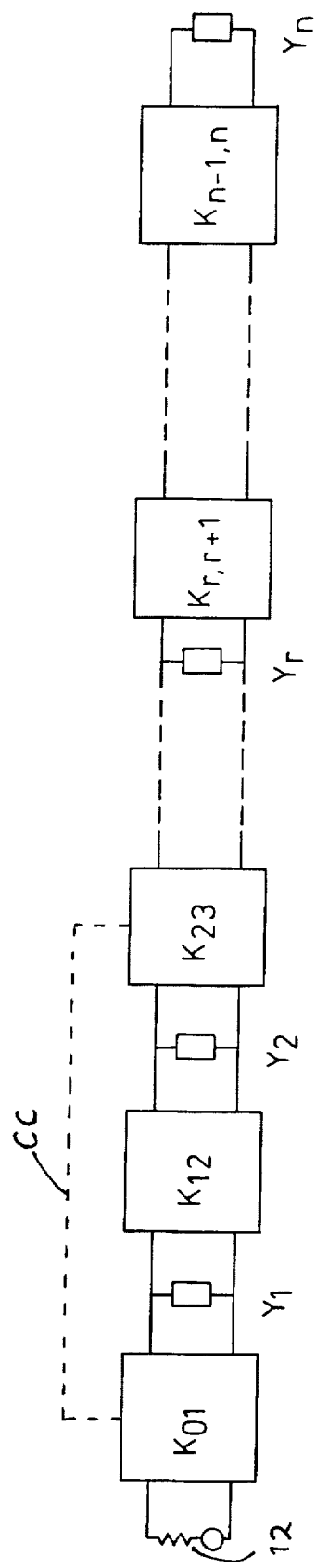
FIG. 5 is a diagram of a ladder network for a filter having a quasi equiripple response.

Forming the input impedance:

$$Z(p,\alpha) = \frac{1 + S_{11}(p,\alpha)}{1 - S_{11}(p,\alpha)} \quad (37)$$

then the ladder structure shown in FIG. 5 may be synthesised to give the characteristic admittance of the inverters as:

$$K_{01} = \sqrt{\frac{\sqrt{\alpha^2 - 1}}{\alpha}} \quad (38)$$

$$K_{r,r+1} = \frac{\sqrt{\alpha^2 - \cos^2(\theta_r)}}{\alpha} \quad r = 1 \to n-1$$

$$\theta_r = \frac{r\pi}{(n+1)}$$

and the admittance of the rth shunt element is $$Y_r = C_r p + G_r \frac{\sqrt{\alpha^2 - 1}}{\alpha} \quad (39)$$

where $C_r$ and $G_r$ are as given in equation (22).

Figure 6:
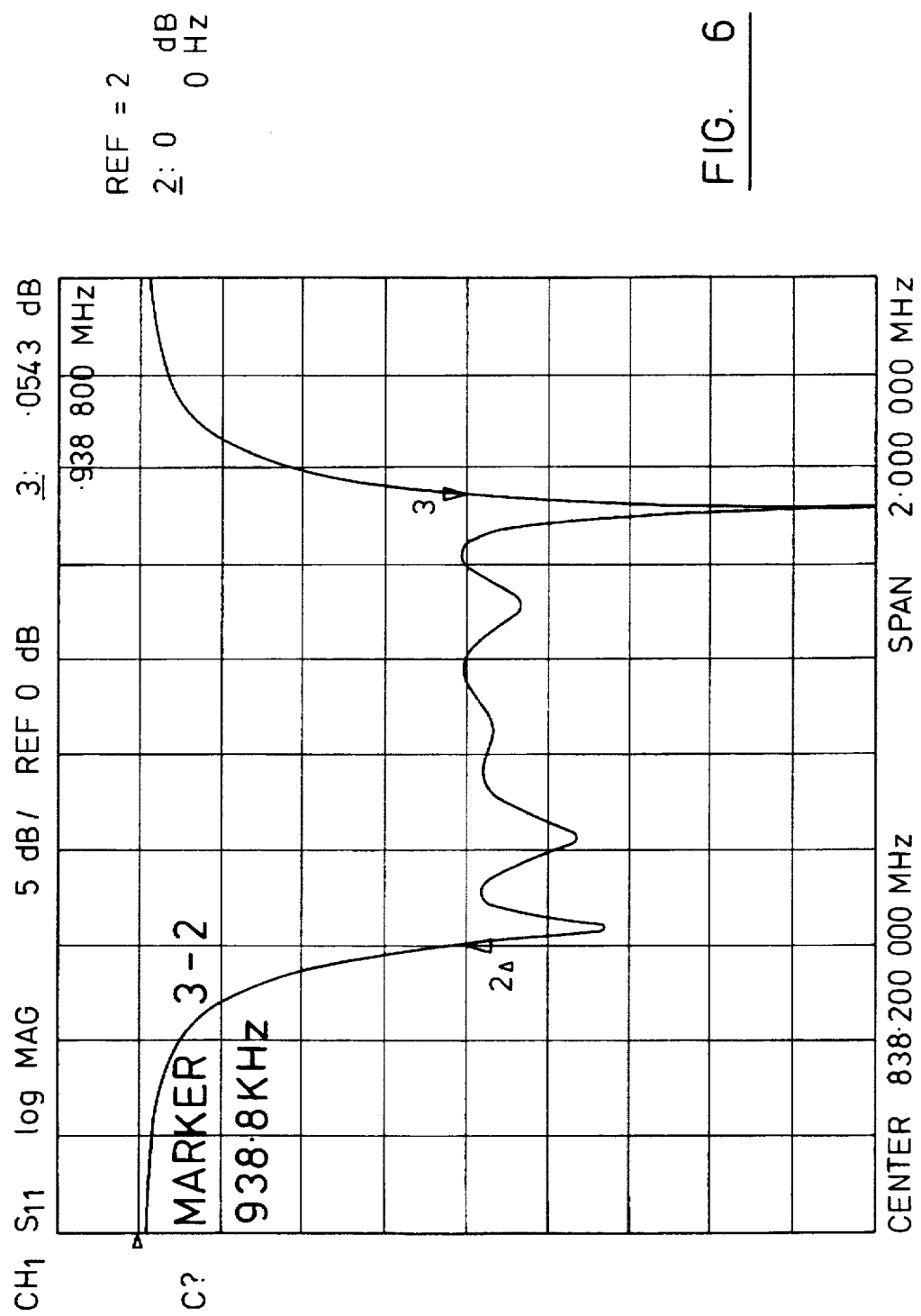
FIG. 6 shows the measured response of a 5th degree filter in accordance with the invention.
Figure 7:
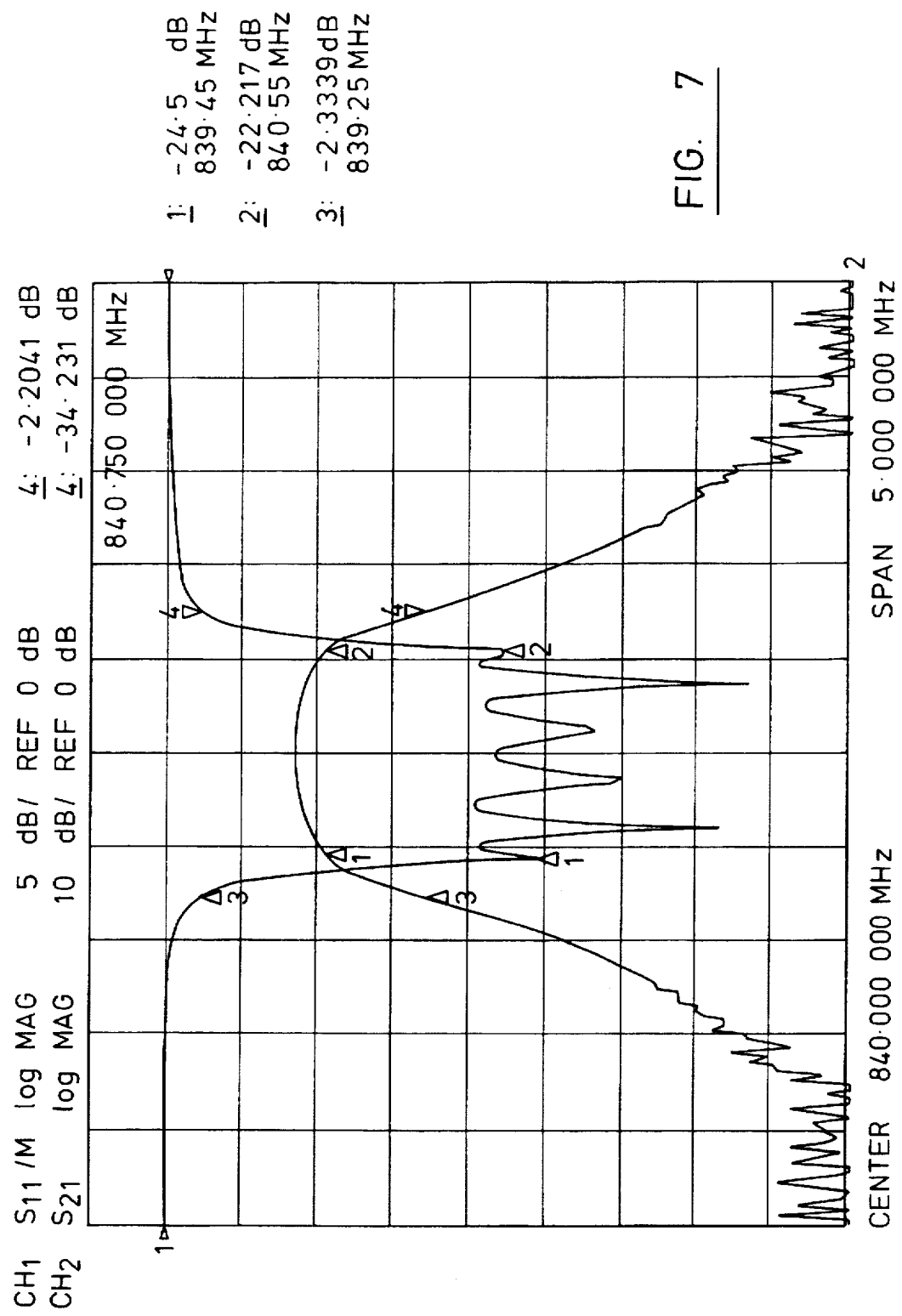
FIG. 7 shows the measured response of a 6th degree filter in accordance with the invention.

We have constructed and tested two experimental devices in accordance with the invention. The first was of degree 5 with a 20 dB stopband of just less than 1 MHz at a centre frequency of 840 MHz. The cavities were TEM resonators where the variable Q was obtained by varying the diameters of the cavities. The measured response is shown in FIG. 6, showing good agreement with theory. The second device was of degree 6 with a 20 dB bandwidth in excess of 1.1 MHz and tuned to a similar centre frequency. In this case, energy was decoupled from the last cavity to form a transmission characteristic:

$$|S_{12}(j\omega)|^2 = \frac{K^2(1-\omega^2)}{(T_{n+1}^2(\alpha) - T_{n+1}^2(\alpha\omega))} \quad (40)$$

and the measured results in FIG. 7 again demonstrate good agreement with theory.

Figure 8:
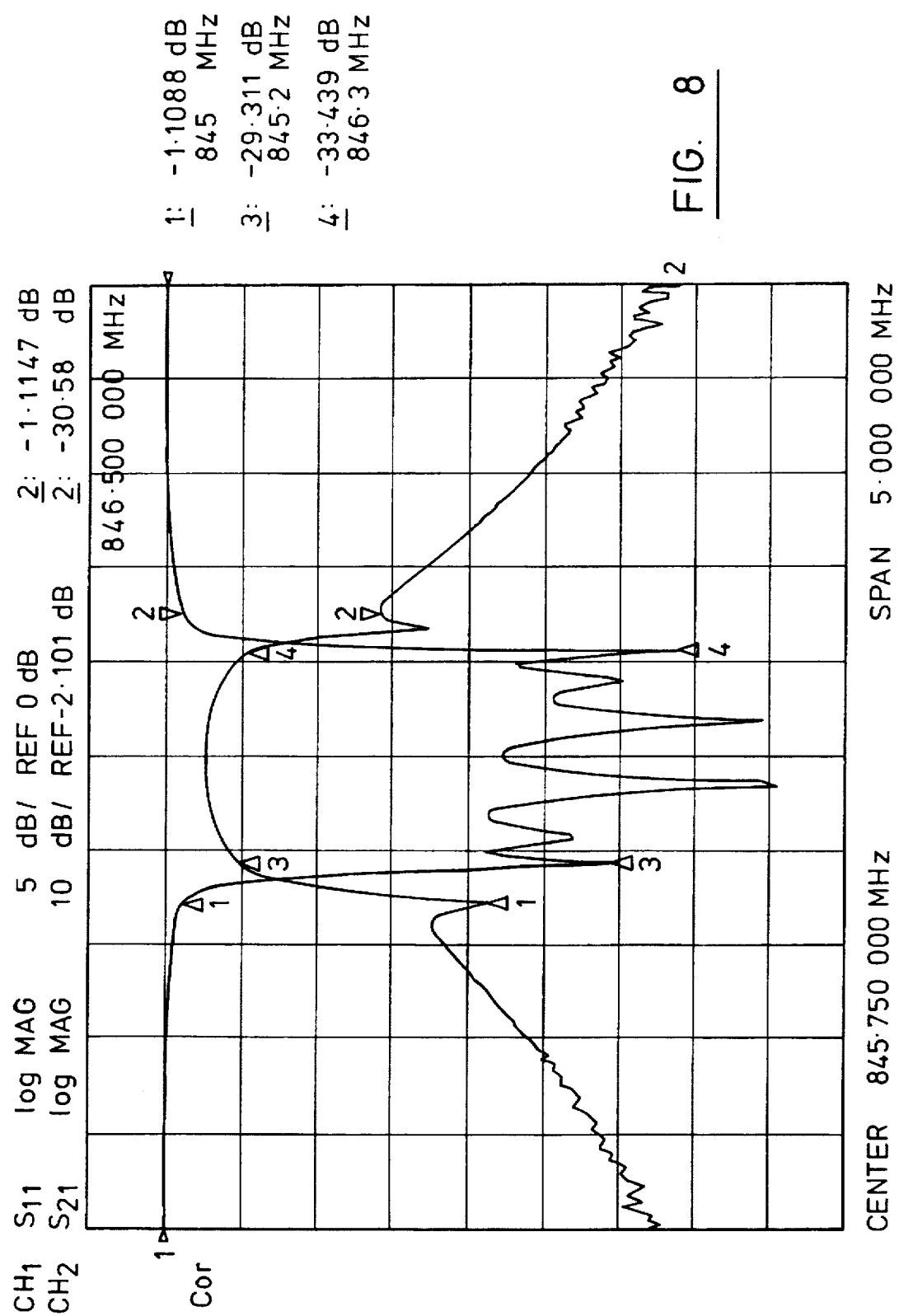
FIG. 8 shows the measured response of a 6th degree filter which includes cross-coupling.
Figure 9:
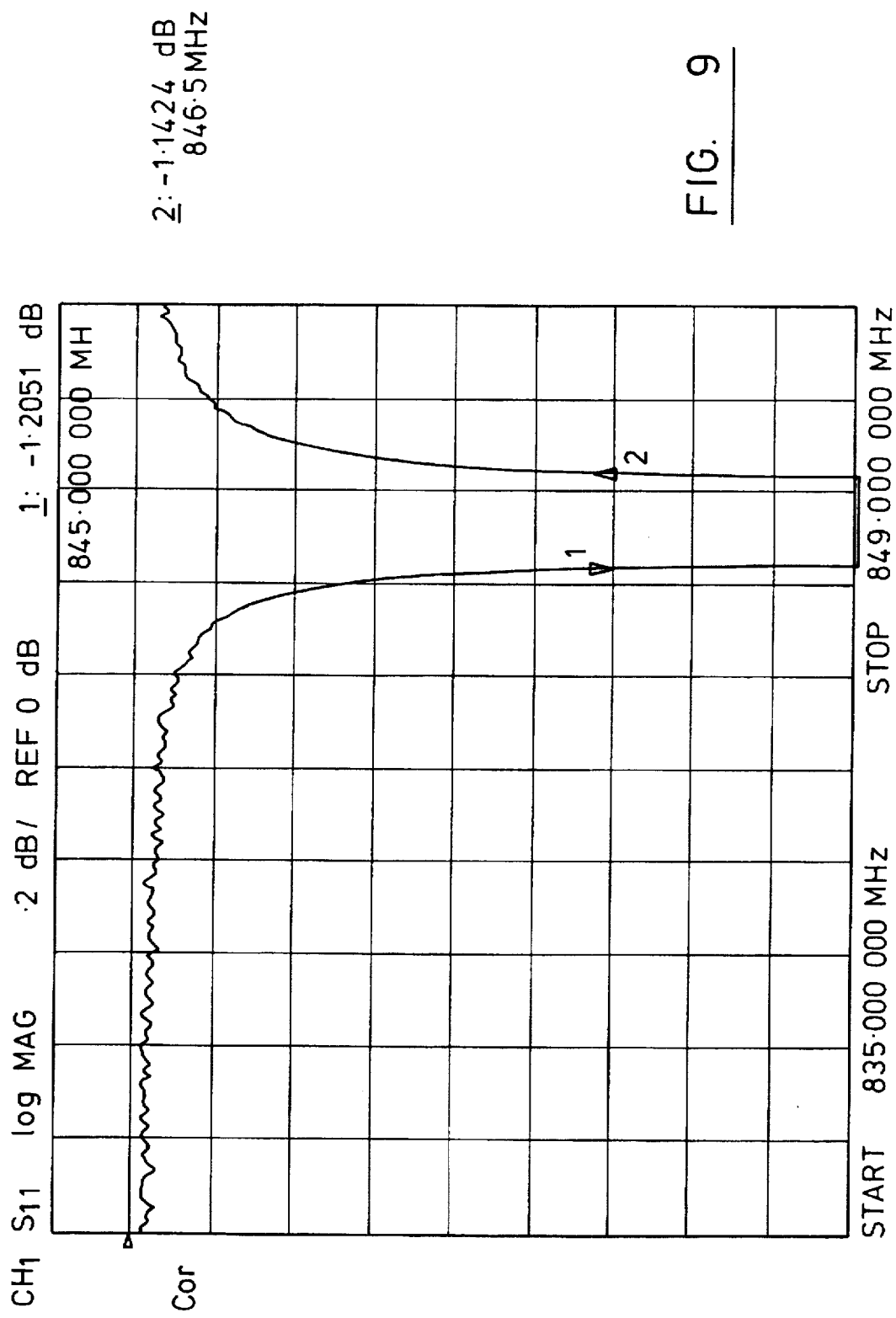
FIG. 9 shows the passband loss of the 6th degree filter with cross-coupling.

An additional coupling (indicated at CC in FIG. 5) was introduced between the input and the third resonator to produce a pair of real frequency transmission zeros close to the band-edge and then the network was optimised. This had the effect of reducing the reflected loss at the points and measured results are shown in FIGS. 8 and 9, showing that a significant reduction in loss can be achieved at the passband edges. In this case, the first two cavities were dielectric resonators.

It will be appreciated that in the variable Q reflection mode filters which have been described, the particular choice of the maximally flat and quasi equiripple solutions to the approximation problem have been shown to lead to explicit formulas for the element values in the ladder network realisations. Experimental devices of degree 5 and 6 have been designed and constructed with the measured results showing good agreement with theory. It will also be appreciated that a reciprocal device can be produced by connecting two reflection mode filters to the output ports of a 3 dB hybrid.

I claim:

1. A microwave reflection mode filter, comprising:

a circulator device having first, second and third ports, said first port forming a signal input port and said third port forming a signal output port; and a one-port filter connected to and terminating said second port of said circulator, said filter including a ladder network of resonators, successive of said resonators having progressively reducing Q values.

2. A microwave reflection mode filter according to claim 1, wherein:

said Q values of said resonators are selected to provide the reflection mode filter with a maximally flat response.

3. A microwave reflection mode filter according to claim 2, having a reflection coefficient given by:

$$S_{11}(p) = \prod_{r=1}^{n} \frac{p^n}{(p - je^{j\theta_r})}$$

where:

$$\theta = \frac{r\pi}{n+1}$$

p is the frequency of the passband and n is an integer indicating the degree of the filter ladder network.

4. A microwave reflection mode filter according to claim 3, wherein the capacitance of each degree of the filter ladder is defined by:

$$C_r = \frac{1}{\cos\theta} \left[ \frac{\sin((r-1)\theta)}{E_{r-1}} + \sin(r\theta)E_r \right]$$

and the conductance of each degree of the filter is defined by:

$$G_r = \frac{1}{E_{r-1}} - E_r$$

where:

$$E_{r-1}E_r = \left[ \frac{\cos\theta + \cos(r\theta)}{\cos\theta + \cos((r-1)\theta)} \right]$$

and:

$$\theta = \frac{\pi}{n+1}$$

5. A microwave reflection mode filter according to claim 4, wherein:

$$Qr = \frac{Cr}{Gr}$$

where Qr is the normalised Q factor of each resonator in the ladder network.

6. A microwave reflection mode filter according to claim 1, wherein:
said Q values of said resonators are selected to provide the reflection mode filter with an equi-ripple or a quasi-ripple response.

7. A microwave reflection mode filter according to claim 6, having a reflection coefficient given by:

$$S_{11}(p,\alpha) = \prod_{r=1}^{n} \left[ \frac{(p\alpha - j\cos\theta_r)}{(p\alpha - j\cos(\cos^{-1}(\alpha) + \theta_r))} \right]$$

where:

$$\theta = \frac{r\pi}{(n+1)}$$

p is the frequency of the passband, α=bandwidth between each ripple, and n is an integer indicating the degree of the ladder network.

8. A microwave reflection mode filter according to claim 7, wherein the capacitance of each degree of the filter ladder is defined by:

$$Cr = \frac{1}{\cos\theta} \left[ \frac{\sin((r-1)\theta)}{E_{r-1}} + \sin(r\theta)E_r \right]$$

and the conductance of each degree of the filter is given by:

$$Gr = \frac{1}{E_{r-1}} - E_r$$

where:

$$E_{r-1}E_r = \left[ \frac{\cos\theta + \cos(r\theta)}{\cos\theta + \cos((r-1)\theta)} \right]$$

9. A microwave reflection mode filter according to claim 8, wherein:

$$Qr = \frac{Cr}{Gr}$$

where Qr is the normalised Q factor of each resonator in the ladder network.

10. A microwave reflection filter according to claim 1, including transmssion zeros.

11. A microwave reflection filter according to claim 10, wherein said transmission zeros are formed by introducing coupling between the input and one of the resonators in the one-port filter.

12. A microwave reflection filter according to claim 11, wherein said coupling is introduced between the input and the third resonator.

* * * * *